United States Patent [19]

Chen et al.

[11] Patent Number: 5,483,088
[45] Date of Patent: Jan. 9, 1996

[54] COMPOUNDS AND INFRARED DEVICES INCLUDING $IN_{1-x}TL_xQ$, WHERE Q IS $AS_{1-y}P_y$ AND $0 \leq Y \leq 1$

[75] Inventors: An-Ban Chen, Auburn, Ala.; Arden Sher, San Carlos; Mark von Schilfgaarde, Palo Alto, both of Calif.

[73] Assignee: S.R.I. International, Menlo Park, Calif.

[21] Appl. No.: 289,391

[22] Filed: Aug. 12, 1994

[51] Int. Cl.$^6$ ................................................. H01L 29/05
[52] U.S. Cl. ...................... 257/189; 257/615; 250/338.4; 250/370.12; 250/493.1; 423/299
[58] Field of Search ........................... 250/338.4, 370.12, 250/370.14, 493.1; 219/553; 423/299; 252/518; 257/189, 188, 184, 613, 615

[56] References Cited

U.S. PATENT DOCUMENTS

| | | |
|---|---|---|
| Re. 29,009 | 10/1976 | Jeffers . |
| 3,805,601 | 4/1974 | Jeffers . |
| 3,849,874 | 11/1974 | Jeffers . |
| 3,875,451 | 4/1975 | Bachmann et al. ............. 250/370.12 X |
| 3,929,970 | 12/1975 | Isaacs et al. ............................ 423/299 |
| 4,291,323 | 9/1981 | Bachmann ............................. 257/189 |
| 4,622,845 | 11/1986 | Ryan et al. . |
| 4,723,448 | 2/1988 | Veligdan . |
| 4,955,699 | 9/1990 | Singh et al. . |

FOREIGN PATENT DOCUMENTS 2127219 4/1984 United Kingdom ................... 252/518

OTHER PUBLICATIONS

Schilfgaarde et al., "InTlSb: An Infrared Detector Material?", Appl. Phys. Lett., vol. 62, No. 16, 1993, pp. 1857–1859.
Razeghi et al., "$In_{1-x}Tl_xSb$ for Long-Wavelength Infrared Photodetectors", The Electrochemical Society, 184th Meeting, New Orleans, Louisiana, Oct. 10–15, 1993.
Choi et al., "Characterization of InTlSb/InSb Grown by Low–Pressure Metal–Organic Chemical Vapor Deposition on a GaAs Substrate", J. Appl. Phys., vol. 75, No. 6, 1994, pp. 3196–3198.
Liao et al., "Electronic Structure of the III–V Tetramer Clusters and Their Positive Ions", Journal of Chemical Physics, 1992, vol. 96, No. 12, pp. 8938–8947. (Abstract Only).
Fung, "Convergent Beam Electron Diffraction Study of Semiconductor Superlattices and High Tc Superconducting Oxides", Application of Electron Microscopy to Materials Science, Held: Gauonzhou, China, 7–9 Aug. 1988, Diffusion and Defect Data–Solid State Data, Part B, (Solid State Phenomena), 1989, vol. B5, pp. 85–101, (Abstract Only).
Finch et al., "Noise Characterization Mode–Locked Laser Sources Using High–Speed InGaAs Photodetectors", IEE Colloquium on 'Applications of Ultrashort Pulses for Optoelectronics', (Digest No. 87), Held: London, UK, 26 May 1989, (Abstract Only).
Karimov et al., "Thermoelectric Properties of TlPse", Inorganic Materials, 1988, vol. 24, No. 3, pp. 406–408 (Abstract Only).
Choi, *Growth and Characterization of InSb and InTlSb for Long Wavelength Infrared Detector Applications*, doctoral thesis, Northwestern University, Nov. 1993.
Staveteig et al., *Photoconductance measurements on InTlSb/InSb/GaAs grown by low–pressure metalorganic chemical vapor deposition*, Appl. Phys. Lett 64(4), 24 Jan. 1994, pp. 460–462.
Razeghi et al., *Growth of InTlSb for Long–Wavelength Infrared Detector Applications*, Center for Quantum Devices, Northwestern University, Jun. 1994.
Bliss et al., *Phosphorus–rich InP Grown by a One Step In–situ MLEK Crystal Growth Process*, 5th International Conference in InP and Related Materials. (No Date).

(List continued on next page.)

Primary Examiner—Carolyn E. Fields
Assistant Examiner—Edward J. Glick
Attorney, Agent, or Firm—Lowe, Price, LeBlanc & Becker

[57] ABSTRACT

A semiconductor layer of $In_{1-x}Tl_xQ$ carried on a substrate forms an infrared device, where Q is selected from the group consisting essentially of $As_{1-y}P_y$ and $0<x<1$, $0<y<1$.

25 Claims, 3 Drawing Sheets

OTHER PUBLICATIONS

Zach et al., *Determination of $Fe^{2+}$ and $Fe^{3+}$ Concentrations in Semi–insulating InP:Fe,* 4th International Conference on InP and Related Materials, pp. 638–640, Apr. 21–24, 1992.

Carlson et al., *Near Infrared Microscopy for the Determination of Dopant Distributions and Segregation in N–Type/InP,* Fourth International Conference on InP and Related Materials, Apr. 21–24, 1992, pp. 515–517.

Nosov, V. B., et al. "Calorimetric measurements of the volume and surface absorption of IR materials in 5–6 μm spectral region," *Soviet Journal of Optical Technology* Apr. 1989, vol. 56, No. 4, pp. 238–240.

Bliss et al., *In–Situ Synthesis and Crystal Growth of High Purity InP,* 4th Int. Conf. on InP and Related Materials, Apr. 21–24, 1992, pp. 262–265.

Bliss et al., *MLEK Crystal Growth of Large Diameter (100) Indium Phosphate,* Journal of Crystal Growth, 128 (1993), pp. 451–456.

COMPOUNDS AND INFRARED DEVICES INCLUDING $In_{1-x}Tl_xQ$, WHERE Q IS $As_{1-y}P_y$ AND $0 \leq Y \leq 1$

FIELD OF INVENTION

The present invention relates generally to compounds including indium and thallium and infrared devices including same, and more particularly to compounds of $In_{1-x}Tl_xQ$, where Q is selected from the group consisting essentially of $As_{1-y}P_y$, $0<x<1$, and $0<y<1$, and to infrared detector and emitter devices including same.

Background Art

The prior art reports staring, i.e., non-scanned, infrared focal plane detector arrays formed of mercury cadmium telluride ($Hg_{.7}TCd_{.3}Te$), indium antimonide (InSb) and Pt:Si for midwave infrared (3–5 microns) and mercury cadmium telluride ($Hg_{.78}Cd_{.22}Te$) for long wavelength (8–12 microns) purposes. An enormous effort has brought these technologies to a mature state where arrays as large as 512 by 512 pixels are manufactured with practical yields, at high, but marginally acceptable, cost. One major failing of the mercury cadmium telluride and indium antimonide based staring focal plane detector arrays is that individual elements of the array must be indium bump-bonded to a readout integrated circuit on silicon substrates as disclosed, for example, in Timlin et al. U.S. Pat. Nos. 5,227,656 and 5,304,500. Such bump-bonding techniques limit array sizes and stability. Large numbers of native defects also limit performance in mercury cadmium telluride arrays. While the platinum silicon arrays can be potentially integrated onto the same silicon chip that houses the readout integrated circuit, such arrays have low quantum efficiencies of approximately 1%, to severely limit performance.

As further demands are made for increased signal-to-noise ratios at higher, or even, non-cryogenic operating temperatures, multi-spectral responses, large arrays of small pixels, longer operational lifetimes and lower production costs, it is dubious if currently available materials will be satisfactory. In the past, several other materials have been suggested to meet these requirements. These other materials have been built of strained layer superlattice structures and have been formed as quantum well infrared photoconductors. These other materials can be built on gallium arsenide substrates, enabling them to be fabricated using monolithic integration with a readout integrated circuit on the same chip. However, these prior art devices have low quantum efficiencies, less than 10%, and quantum wells having awkward optical arrangements.

It is, accordingly, an object of the present invention to provide a new and improved infrared device.

Another object of the present invention is to provide a new and improved infrared detector that can be grown on a substrate that also carries a read-out integrated circuit, to obviate the requirement for bump-bonding.

Another object of the invention is to provide a new and improved infrared detector that can be grown on an indium phosphide substrate and is substantially lattice matched to the indium phosphide, to obviate the need for superlattice structures.

Another object of the invention is to provide a new and improved infrared detector compound that can be tailored, with the selection of appropriate mole fractions, to detecting differing wavelengths in the infrared spectrum.

Another object of the invention is to provide a new and improved pseudo-binary alloy compound, particularly adapted for use in infrared detectors and emitters.

SUMMARY OF THE INVENTION

In accordance with one aspect of the present invention, an infrared detector or emitter device comprises a substrate and a semiconductor layer of $In_{1-x}Tl_xQ$ carried by the substrate, where Q is selected from the group consisting essentially of $As_{1-y}P_y$ and $0<x<1$, $0 \leq y \leq 1$. In first and second embodiments of the invention, y=1 and y=0, respectively, so that the layer consists essentially of semiconductor $In_{1-x}Tl_xP$ or $In_{1-x}Tl_xAs$. Based on investigations we have conducted, semiconductor layers of $In_{1-x}Tl_xP$ and $In_{1-x}Tl_xAs$ are rugged and can be epitaxially grown in zinc blende structure for all values of x with lattice constants nearly matching those of InP and InAs, respectively. Such epitaxially grown semiconductor layers of $In_{1-x}Tl_xP$ and $In_{1-x}Tl_xAs$ are comparatively free of native point defects and have the high mobility and infrared absorption characteristics needed for high performance infrared detector and emitter devices. Based on our investigations, TlP is a semimetal having a negative band gap (−0.27 eV) analogous to that of mercury telluride (−0.30 eV). The band gap of semiconductor $In_{1-x}Tl_xP$ (the band gaps of semiconductors are always positive) spans the entire long and midwavelength infrared spectra, for different values of x less than 0.76.

InP is desirable for the substrate of $In_{1-x}Tl_xP$ because it is a high mobility, low dislocation electronic material similar to gallium arsenide, capable of forming ohmic contacts as well as p and n hetero- and homojunctions. In addition, InP has a functional passivant/insulator ($SiO_2$), enabling it to support high performance read-out integrated circuit devices. Thus, based on our investigations, semiconductor $In_{1-x}Tl_xP$ epitaxially grown on indium phosphide (InP) can satisfy all system requirements. Semiconductor $In_{1-x}Tl_xAs$ is also a suitable infrared detector with many of the same properties of $In_{1-x}Tl_xP$. InAs is the substrate best suited for $In_{1-x}Tl_xAs$. However, $In_{1-x}Tl_xP$ is preferred over $In_{1-x}Tl_xAs$ because InP is a better substrate than InAs. This is because InP can be doped, has better device performance and can be lattice-matched better to semiconductor $In_{1-x}Tl_xP$ than semiconductor $In_{1-x}Tl_xAs$ can be matched to InAs. In addition, semiconductor $In_{1-x}Tl_xP$ and InP substrates offer the advantage of monolithic integration into a readout integrated circuit chip.

We are aware that attempts have been made to produce long wavelength infrared detectors in which layers of indium thallium antimony compounds ($In_{1-x}Tl_xSb$) are deposited on indium antimonide (InSb). *Applied Physics Letters*, Vol. 62, page 1857 (1993) (M. von Schilfgaarde et al.). A significant drawback in the use of $In_{1-x}Tl_xSb$ is that it favors a more closely packed structure to the zinc blende. However, the greatest disadvantage in the attempted use of $In_{1-x}Tl_xSb$, which does not appear to arise in $In_{1-x}Tl_xP$ or $In_{1-x}TlAs$, is that $In_{1-x}Tl_xSb$ cannot be successfully grown on a zinc blende lattice. This failure appears to occur because $In_{1-x}Tl_xSb$ does not have a strong enough thermodynamic force to drive Tl onto the zinc blende lattice.

The above and still further objects, features and advantages of the present invention will become apparent upon consideration of the following detailed descriptions of specific embodiments thereof, especially when taken in conjunction with the accompanying drawings.

DESCRIPTION OF THE PREFERRED EMBODIMENT

Figure 1:
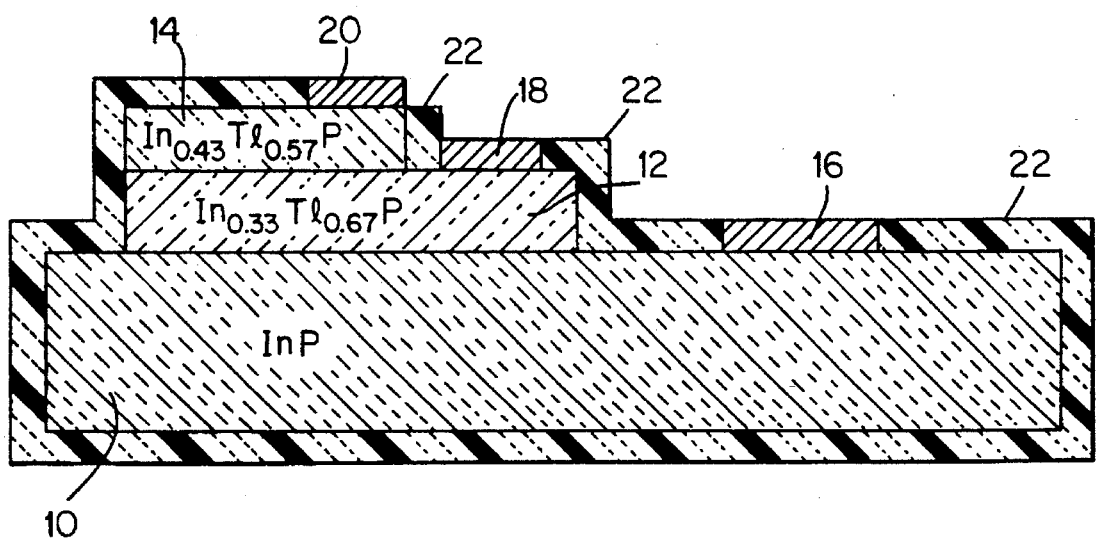
FIG. 1 is a side view of a preferred embodiment of the invention.

Reference is now made to FIG. 1 of the drawing wherein there is illustrated an infrared device capable of detecting long wavelength infrared radiation having a cutoff wavelength of 12 microns and for separately detecting medium wavelength infrared energy having a cutoff wavelength of 5 microns. The structure illustrated in FIG. 1 can be operated as a photovoltaic or as a photoconductive detector, depending on the bias voltages to which electrodes thereof are connected.

In the embodiment of FIG. 1, indium phosphide (InP), semi-metallic bulk substrate 10 has deposited thereon, preferably by any of liquid phase epitaxy, metalorganic chemical vapor epitaxy, metalorganic molecular beam epitaxy or molecular beam epitaxy methods, a rugged semiconductor alloy layer of n type indium thallium phosphide 12 ($In_{1-x1}Tl_{x1}P$) having a zinc blende structure. InP substrate 10 is a good electronic material, i.e. has high carrier mobility, low dislocation density (similar to GaAs), has virtually no native point defects, easily has ohmic contacts and p-n junctions formed thereon, is easily doped, can easily be coated with a function passivant/insulator ($SiO_2$), and electronic devices formed thereon have good, consistent performance characteristics. The value of x for the compound of layer 12 is selected such that layer 12 absorbs long wavelength infrared energy preferably having a cutoff wavelength of 12 microns and is approximately lattice matched to InP substrate 10. Based on studies we have performed, lattice matching is about 1% and the 12 micron wavelength cutoff are attained with a value of $x_1=0.67$, whereby layer 12 has a bandgap of about 0.1 eV. Layer 12 is doped with silicon to achieve n type conductivity.

Deposited on layer 12, also by any of the foregoing methods, is a further indium thallium phosphide semiconductor layer 14 ($In_{1-x2}Tl_{x2}P$). Based on studies we have conducted, with $x_2=0.57$ rugged layer 14 absorbs midrange infrared energy having a cutoff wavelength of 5 microns (associated with a bandgap of 0.28 eV), while passing the long wavelength infrared energy that is absorbed by layer 12. The indium thallium phosphide compound of layer 14 is doped with any one of zinc, magnesium or beryllium to form a p type layer, whereby a p-n homojunction is formed at the intersection of layers 12 and 14.

Aluminum ohmic contacts 16, 18 and 20 are respectively formed on exposed upper surfaces of layers 12 and 14 and substrate 10. Electrodes 16, 18 and 20 are connected to suitable electronic circuits to bias the device into a photoconductive state or enable the device to operate in the photovoltaic mode. All remaining, exposed surfaces of substrate 10 and of layers 12 and 14 are covered with passivating silicon dioxide (SiOn) layer 20.

The structure of FIG. 1 can be modified to detect infrared energy having a single cut-off wavelength of 5 microns or 12 microns. To provide a cut-off wavelength of only 5 microns, layer 14 and electrode 16 associated therewith are eliminated and the device is arranged so the infrared energy is incident on layer 12. To provide a cut-off wavelength of 12 microns, layer 12 is replaced with a superlattice arrangement of $In_{1-x3}Tl_{x3}P$ (where $x_3$ varies from 0.67 to 0.57) that is lattice matched to substrate 10.

In an actual staring infrared focal plane detector, many devices of the type illustrated in FIG. 1 are arranged in a matrix of rows and columns on InP substrate 10 on which are also deposited CMOS bias and readout transistors, as well as metal row and column strips and other components.

While the preferred configuration includes an InP substrate and one or more $In_{1-x}Tl_xP$ layers, the substrate can also be bulk semimetallic InAs carrying a semiconductor zinc blende layer of $In_{1-x3}Tl_{x3}As$, where $0 \leq x_3 \leq 1$; for a 5 micron cut-off of the $In_{1-x3}Tl_{x3}As$ layer, $x_3=0.15$. The invention is not limited to the pseudobinary compounds $In_{1-x1}Tl_{x1}P$ and $In_{1-x2}Tl_{x2}As$ for layers 12 and 14, but can be expanded to include the generalized pseudotertiary compound $In_{1-x}Tl_{x1}P$, where Q is selected from the group consisting essentially of $As_{1-y}P_y$, where $0 < x_4 < 1$ and $0 \leq y \leq 1$. For $y=0$ or $y=1$, we have the specialized cases of the pseudobinary compounds $In_{1-x3}Tl_{x3}As$ and $In_{1-x3}Tl_{x3}P$, respectively. For $0 < y < 1$, we have the above-noted generalized pseudotertiary compound which our studies show can detect and emit infrared energy to tailored wavelengths in the spectra of interest. It is to be understood that the substrates are not limited to the preferred compounds of InP and InAs but that the substrate can be formed of other materials, particularly silicon or gallium arsenide in semiconductor form. The $In_{1-x}Tl_xQ$ layer carried by such a substrate is physically connected to the substrate by an appropriate superlattice structure.

Figure 2:
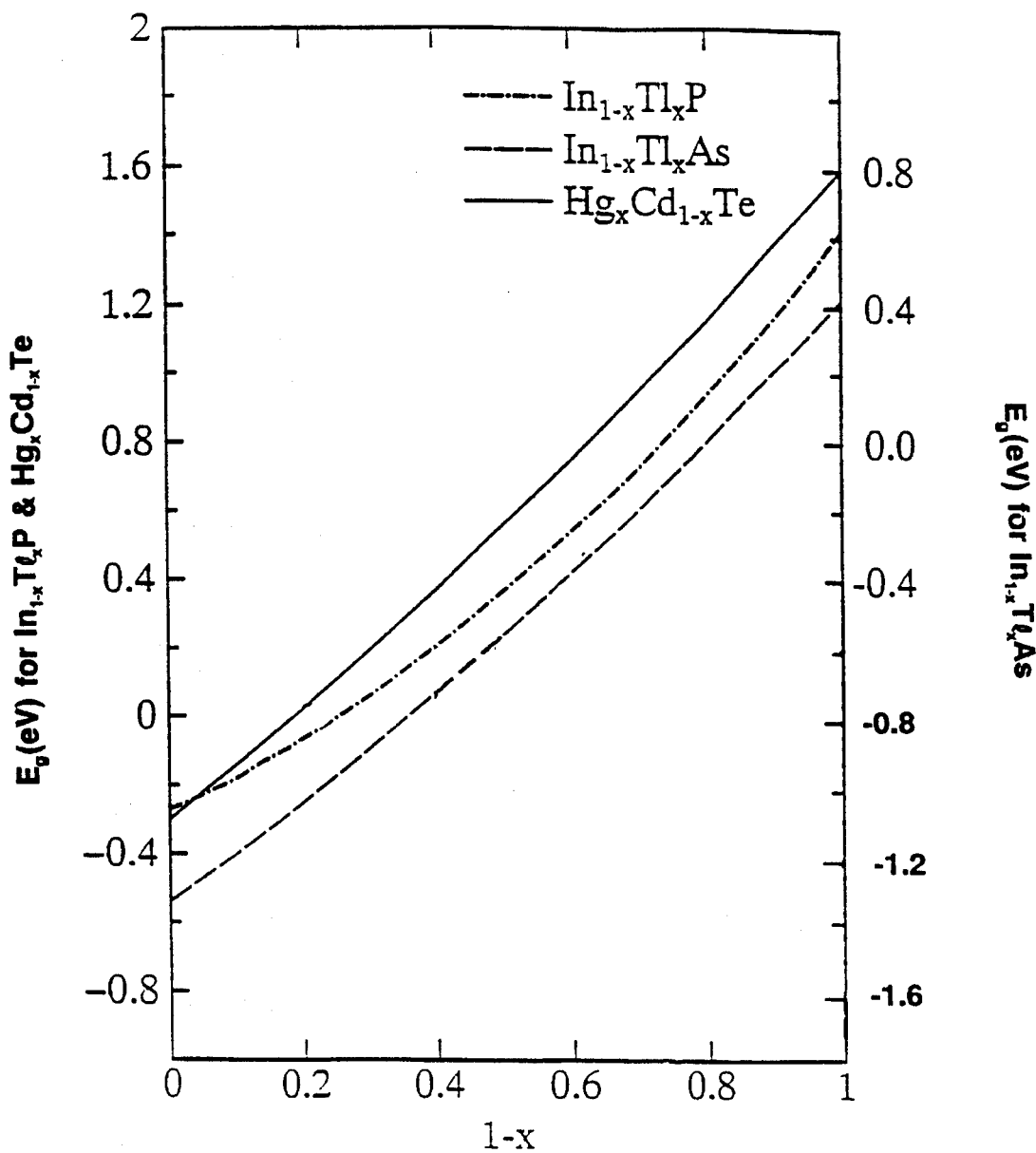
FIG. 2 are plots of energy band gap vs. values of x for each of $In_{1-x}Tl_xP$, $In_{1-x}Tl_xAs$ and $Hg_xCd_{1-x}Te$.
Figure 3:
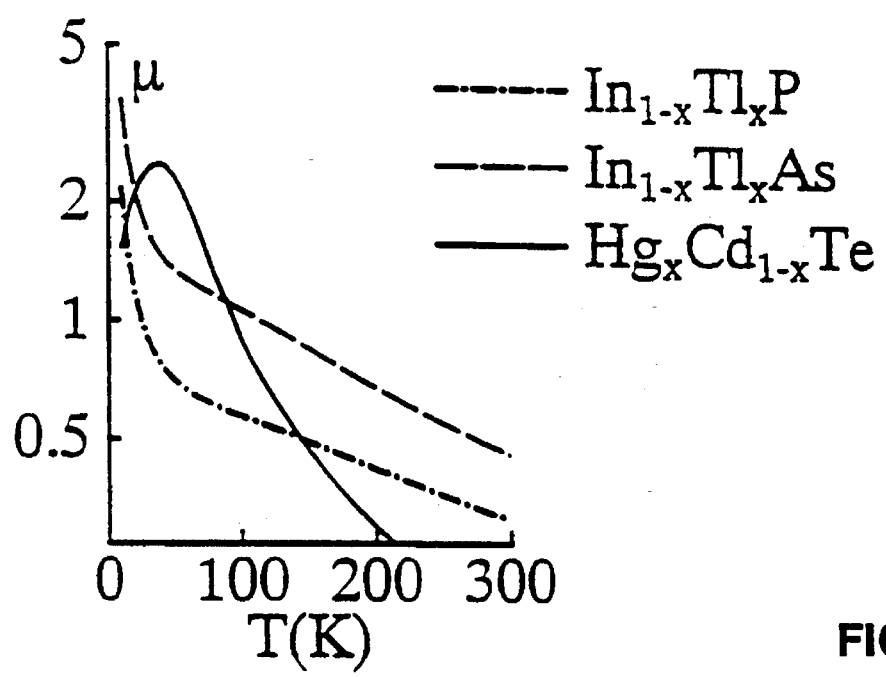
FIG. 3 are plots of electron mobility vs. temperature for each of $In_{0.33}Tl_{0.67}P$, $In_{0.85}Tl_{0.15}As$ and $Hg_{0.75}Cd_{0.22}Te$.

Based on the studies we have performed, the bandgap energies (hence the cut-off wavelengths) of $In_{1-x}Tl_xP$ and $In_{1-x}Tl_xAs$ (shown in FIG. 2 by plotted lines 22 and 24, respectively) in accordance with this invention and the prior art compound $Hg_xCd_{1-x}Te$ (shown by plotted line 26) are illustrated as a function of the value of x in the interval $0 \leq x \leq 1$. From FIG. 2, any desired band gap, hence cut-off wavelength, can be attained by proper selection of the value of x. The higher electron mobilities of the compounds of the present invention relative to the mobility of the prior art HgCdTe at temperatures approaching room temperature are clearly shown in FIG. 3. FIG. 3 includes plots based on our studies of electron mobility (in $10^5 cm^2/V.sec$) vs. temperature of $In_{0.33}Tl_{.67}P$ (line 28), $In_{.85}Tl_{.13}As$ (line 30) and $Hg_{.78}Cd_{.22}Te$ (line 32), all p doped with zinc at $10^{14}/cm^3$ to have a band gap energy of 0.1 eV. Hence, our studies show that layers of the present invention do not require the extensive refrigeration structure required by the prior art.

The ruggedness, i.e. structural stability, of the zinc blende (four-fold coordination) $In_{1-x}Tl_xP$ and $In_{1-x}Tl_xAs$ lattice structures of the present invention can be determined from the binding energy of the atoms of these compounds. Our studies have shown these compounds in zinc blende form to be light open structures having strong directional bonds relative to other compounds of the cations Al Ga and In with the anions P, As and Sb in more closely packed NaCl (six-fold coordination) and CsCl (eight-fold coordination) structures. For TlSb, the NaCl and CsCl structures overtake the zinc blende structure, a manifestation of which is a very negative band gap of TlSb. This reversal in the ordering of the TlSb energy causes complications when attempts are made to grow the prior art $In_{1-x}Tl_xSb$ alloy. Our studies show that TlP and TlAs are stable relative to the more closely packed phases of the prior art compounds, whereby $In_{1-x}Tl_xP$ and $In_{1-x}Tl_xAs$ are stable and can be produced without excessive problems.

Our studies show $In_{.33}Tl_{.67}P$ has excellent long wavelength infrared properties relative to the prior art $Hg_{.78}Cd_{.22}Te$ because inter alia:

1. its 5.96 Å lattice constant closely matches the 5.83 Å lattice constant of the InP substrate on which it is deposited so the $In_{.33}Tl_{.67}P$ liquidus and solidus phase diagrams have simple lens shapes;

2. the cohesive energy per atom (2.56eV/atom) of TlP is 58% greater than that of HgTe (1.62eV/atom);

3. TlP is a semimetal having a band gap of −0.27eV, about the same as HgTe (−0.3eV);

4. its band gap concentration variation (dEg/dx) of 1.42 is 16% smaller than $Hg_{.78}Cd_{.22}Te$;

5. its elastic constants are about 33% greater than those of $Hg_{.78}Cd_{.22}Te$;

6. the temperature variation of the band gap (dEg/dT) near 77° K is small (about −0.05 meV/° K.), approximately 15% that of $Hg_{.78}Cd_{.22}Te$ (about −0.36 meV/° K.); because of the low value of dEg/dT for $In_{.33}Tl_{.67}P$, design of circuits including that compound for variable temperature operation is greatly simplified and spatial variations in pixel performance of detector elements in a large matrix array due to temperature gradients within the array are virtually eliminated;

7. its electron effective mass is 0.008, equal virtually to that of $Hg_{.78}Cd_{.22}Te$; and 8. its hole effective mass is 0.37, 43% smaller than the 0.65 hole effective mass of $Hg_{.78}Cd_{.22}Te$, resulting in considerably higher hole mobility and substantially longer electron Auger recombination lifetimes for $In_{.33}Tl_{.67}P$.

While there have been described and illustrated several specific embodiments of the invention, it will be clear that variations in the details of the embodiments specifically illustrated and described may be made without departing from the true spirit and scope of the invention as defined in the appended claims. For example, the invention can be used to form a solar cell having a cut-off wavelength such that a very large portion of the infrared spectrum is converted by photovoltaic action into electrical energy; in such an instance a layer of $In_{.24}Tl_{.76}P$ is formed on an InP substrate. The compounds of the invention can also be used to form layers of infrared emitters in combination with the usual other structures of such emitters.

We claim:

1. An infrared detector or emitter device comprising a substrate, and a semiconductor layer of $In_{1-x}Tl_xQ$ carried by the substrate, where Q is selected from the group consisting essentially of $As_{1-y}P_y$ and $0<x<$, $0\leq y\leq 1$.

2. The device of claim 1 where y=1.

3. The device of claim 2 where x=0.67.

4. The device of claim 2 where x=0.57.

5. The device of claim 1 where x=0.24.

6. The device of claim 2 wherein the layer is formed on the substrate and the substrate portion on which the layer is formed consists essentially of InP.

7. The device of claim 6 wherein the layer is doped to have a first conductivity polarization.

8. The device of claim 7 wherein another layer of $In_{1-x}Tl_xP$ having a second conductivity polarization is formed on the layer having the first polarization to form a p-n homojunction.

9. The device of claim 1 where y=0.

10. The device of claim 9 where x=0.15.

11. The device of claim 10 wherein the layer is formed on the substrate and the substrate portion on which the layer is formed consists essentially of InAs.

12. The device of claim 1 wherein the layer is doped to have a first conductivity polarization, and a second layer having substantially the same compound as the layer having the first conductivity polarization contacting the first conductivity polarization layer to form a p-n homojunction, the second layer being doped to have a second conductivity polarization.

13. The device of claim 1 wherein the layer is formed on the substrate and the substrate portion on which the layer is formed consists essentially of InQ, the layer and substrate having substantially the same lattice constants.

14. The device of claim 13 where y=1.

15. The device of claim 13 where y=0.

16. The device of claim 13 where 0<y<1.

17. The device of claim 1 where 0<y<1.

18. The device of claim 1 wherein the device is a detector and the substrate includes a second layer of $In_{1-z}Tl_zQ$, where z is less than x, the second layer being positioned above the $In_{1-x}Tl_xQ$ layer so certain optical radiation wavelengths incident on the second layer pass through the second layer and are absorbed by the $In_{1-x}Tl_xQ$ layer and other optical radiation wavelengths incident on the second layer are absorbed thereby.

19. The device of claim 18 where y=1, x=0.67, z=0.57.

20. The device of claim 1 where y=1, x=0.24.

21. The device of claim 1 further including an ohmic contact on the layer.

22. $In_{1-x}Tl_xQ$, where Q is selected from the group consisting essentially of $As_{1-y}P_y$ and $0<x<1$, $0\leq y\leq 1$.

23. The composition of claim 22 where y=0.

24. The composition of claim 22 where y=1.

25. The composition of claim 22 where 0<y<1.

* * * * *